(12) United States Patent
Wu

(10) Patent No.: US 9,506,699 B2
(45) Date of Patent: Nov. 29, 2016

(54) HEAT PIPE STRUCTURE

(75) Inventor: Chun-Ming Wu, New Taipei (TW)

(73) Assignee: Asia Vital Components Co., Ltd., New Taipei (TW)

(*) Notice: Subject to any disclaimer, the term of this patent is extended or adjusted under 35 U.S.C. 154(b) by 487 days.

(21) Appl. No.: 13/402,458

(22) Filed: Feb. 22, 2012

(65) Prior Publication Data

US 2013/0213610 A1 Aug. 22, 2013

(51) Int. Cl.
*F28D 15/04* (2006.01)
*F28D 15/02* (2006.01)
*H01L 23/427* (2006.01)
*H05K 7/20* (2006.01)

(52) U.S. Cl.
CPC ......... *F28D 15/046* (2013.01); *F28D 15/0233* (2013.01); *H01L 23/427* (2013.01); *H05K 7/20336* (2013.01)

(58) Field of Classification Search
CPC .......................... H01L 23/427; H05K 7/20336
USPC ............................................ 165/80.2, 104.26
See application file for complete search history.

(56) References Cited

U.S. PATENT DOCUMENTS

| | | | |
|---|---|---|---|
| 6,082,443 A * | 7/2000 | Yamamoto et al. ...... | 165/104.26 |
| 6,148,906 A * | 11/2000 | Li et al. .................... | 165/104.33 |
| 6,619,384 B2 * | 9/2003 | Moon et al. ............. | 165/104.26 |
| 6,679,318 B2 * | 1/2004 | Bakke ...................... | 165/104.26 |
| 7,540,319 B2 * | 6/2009 | Mochizuki et al. ...... | 165/104.26 |
| 7,609,520 B2 * | 10/2009 | Chang et al. ................ | 361/700 |
| 8,780,559 B2 * | 7/2014 | Weaver, Jr. ........... | H01L 23/427 |
| | | | 165/104.21 |
| 2006/0124280 A1* | 6/2006 | Lee et al. ................. | 165/104.26 |
| 2006/0151153 A1* | 7/2006 | Chen ........................ | 165/104.26 |
| 2006/0157227 A1* | 7/2006 | Choi ...................... | B82Y 30/00 |
| | | | 165/104.21 |
| 2006/0266499 A1* | 11/2006 | Choi et al. ............... | 165/104.21 |
| 2007/0012429 A1* | 1/2007 | Siu .......................... | 165/104.33 |
| 2007/0035927 A1* | 2/2007 | Erturk et al. ................. | 361/700 |
| 2007/0089864 A1* | 4/2007 | Chang et al. ............ | 165/104.26 |
| 2007/0131387 A1* | 6/2007 | Kawabata et al. ........... | 165/80.3 |
| 2007/0284082 A1* | 12/2007 | Sung ........................... | 165/80.3 |
| 2008/0142196 A1* | 6/2008 | Jeng .......................... | 165/104.26 |
| 2009/0084526 A1* | 4/2009 | Chang et al. ............. | 165/104.26 |
| 2009/0139696 A1* | 6/2009 | Shih et al. ................ | 165/104.26 |

(Continued)

FOREIGN PATENT DOCUMENTS

| CN | 100463150 C | 2/2009 | |
|---|---|---|---|
| CN | 101900506 | * 12/2010 | ........... F28D 15/046 |

(Continued)

*Primary Examiner* — M. Alexandra Elve
*Assistant Examiner* — Joel Attey
(74) *Attorney, Agent, or Firm* — C. G. Mersereau; Nikolai & Mersereau, P.A.

(57) ABSTRACT

A heat pipe structure includes a main body having a chamber. The chamber has a first side and a second side. A first capillary structure and a second capillary structure are respectively disposed on the first and second sides. A working fluid is filled in the chamber. The first capillary structure has a radial extension range larger than or equal to one half of a circumference of inner wall face of the chamber and larger than a radial extension range of the second capillary structure. The first and second capillary structures are connected with each other. The first and second capillary structures and the inner wall face of the chamber together define at least one vapor passage. By means of the heat pipe structure, the amount of transferred heat is increased and the heat transfer efficiency is greatly enhanced.

1 Claim, 5 Drawing Sheets

(56) References Cited

U.S. PATENT DOCUMENTS

| | | | |
|---|---|---|---|
| 2009/0166014 A1* | 7/2009 | Chang et al. | 165/133 |
| 2009/0173475 A1* | 7/2009 | Hsiao et al. | 165/104.33 |
| 2010/0157535 A1* | 6/2010 | Oniki et al. | 361/700 |
| 2010/0266864 A1* | 10/2010 | Lee | 428/557 |
| 2010/0294475 A1* | 11/2010 | Rush et al. | 165/185 |
| 2011/0174465 A1* | 7/2011 | Liu et al. | 165/104.26 |

FOREIGN PATENT DOCUMENTS

| | | |
|---|---|---|
| TW | 200923307 A | 6/2009 |
| TW | 201038896 A1 | 11/2010 |
| TW | 201142232 A1 | 12/2011 |

* cited by examiner

HEAT PIPE STRUCTURE

BACKGROUND OF THE INVENTION

1. Field of the Invention

The present invention relates generally to an improved heat pipe structure, and more particularly to a heat pipe structure, which is able to reduce thermal impedance pressure and greatly enhance the vapor-liquid circulation of the working fluid in the heat pipe and increase the heat transfer efficiency.

2. Description of the Related Art

There is a more and more obvious trend to miniaturization of all kinds of high-performance computers, intelligent electronic devices and other electrical equipments. To catch up this trend, the heat transfer components and heat dissipation components used in these devices have also been more and more miniaturized and thinned to meet the requirements of users.

It is known that heat pipe is a heat transfer component with excellent thermal conductivity. The thermal conductivity of the heat pipe is several times to several tens times the thermal conductivity of copper, aluminum or the like. Therefore, the heat pipe is used as a cooling component and applied to various electronic devices.

As to the configuration, the conventional heat pipes can be classified into heat pipes in the form of circular tubes, heat pipes with D-shaped cross sections and flat-plate heat pipes. The heat pipes are mainly used to conduct the heat generated by the heat sources in the electronic devices and cool the heat sources. Currently, in view of easy installation and larger contact area, flat-plate heat pipes are widely used for cooling the heat sources. Following the miniaturization of the cooling mechanism, various flat-plate heat pipes are widely applied to the electronic devices for conducting the heat generated by the heat-generating components.

The conventional heat pipe structure can be manufactured by means of many kinds of methods. For example, the heat pipe can be manufactured in such a manner that metal powder is filled into a hollow tubular body and sintered to form a capillary structure layer on the inner wall face of the tubular body. Then the tubular body is vacuumed and filled with a working fluid and then sealed. Alternatively, a metal-made mesh body is placed into the tubular body. The mesh capillary structure body will naturally outward stretch and expand to attach to the inner wall face of the tubular body to form a capillary structure layer. Then the tubular body is vacuumed and filled with a working fluid and then sealed. To meet the requirements for miniaturization and thinning of the electronic devices, the heat pipe needs to be manufactured with the form of a flat plate.

The flat-plate heat pipe can achieve object of thinning. However, this leads to another problem. That is, in the flat-plate heat pipe, the metal powder is sintered to form a capillary structure layer fully coated on the inner wall face of the heat pipe. When compressing the flat-plate heat pipe, the capillary structure, (that is, the sintered metal powder or mesh capillary structure body) in the flat-plate heat pipe on two sides of the compressed faces is likely to be squeezed and damaged. In this case, the capillary structure tends to peel off from the inner wall face of the flat-plate heat pipe. This will greatly deteriorate the heat transfer performance of the thin heat pipe or even make the thin heat pipe lose its function. Moreover, although the flat-plate heat pipe can conduct the heat, after thinned and flattened, the internal capillary structure of the flat-plate heat pipe will have insufficient capillary attraction. As a result, the working fluid will block the vapor passage. Furthermore, after thinned, the area of the flow passage inside the flat-plate heat pipe is reduced so that the capillary attraction is lowered. As a result, the maximum heat transfer amount is lowered. On one hand, this is mainly because after thinned, the internal capacity of the flat-plate heat pipe is reduced and on the other hand, this is because after flattened, the central section of the flat-plate heat pipe is recessed to narrow or even block the vapor passage.

To solve the above problems existing in the conventional heat pipe, some manufacturers in this field insert a core bar into the internal chamber of the flat-plate heat pipe. The core bar is formed with a specific axial cut. Metal powder is filled into the space defined by the cut and the inner wall face of the chamber. Then the metal powder is sintered to form a capillary structure at the central section of the chamber. Then the core bar is extracted out. Then the central section of the chamber is compressed and flattened. The capillary structure thermally contacts the plane parts of the inner wall face of the chamber. In addition, voids are formed on two sides of the capillary structure in the chamber to serve as the vapor passages. Accordingly, better vapor passage impedance is achievable. However, the cross-sectional area of the capillary structure is quite narrow so that the capillary attraction is lowered. As a result, the anti-gravity thermal efficiency and heat transfer efficiency are poor.

SUMMARY OF THE INVENTION

A primary object of the present invention is to provide an improved heat pipe structure, which is able to increase heat conduction efficiency and heat transfer efficiency.

A further object of the present invention is to provide the above heat pipe structure, which is able to increase anti-gravity performance.

To achieve the above and other objects, the heat pipe structure of the present invention includes a main body having a chamber. The chamber has a first side and a second side. A first capillary structure and a second capillary structure are respectively disposed on the first and second sides. A working fluid is filled in the chamber. The first capillary structure has a radial extension range larger than or equal to one half of a circumference of inner wall face of the chamber and larger than a radial extension range of the second capillary structure. The first and second capillary structures are connected with each other. The first and second capillary structures and the inner wall face of the chamber together define at least one vapor passage.

By means of the heat pipe structure, the anti-gravity performance of the heat pipe is greatly promoted and the vapor-liquid circulation efficiency of the working fluid in the heat pipe is enhanced. According to the above, the heat pipe structure of the present invention has the following advantages:

1. The heat pipe structure of the present invention can bear greater thermal power impact per unit area.

2. The heat pipe structure of the present invention can increase the maximum heat transfer efficiency.

3. The heat pipe structure of the present invention has better anti-gravity performance.

4. The heat pipe structure of the present invention has smaller interface thermal resistance.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
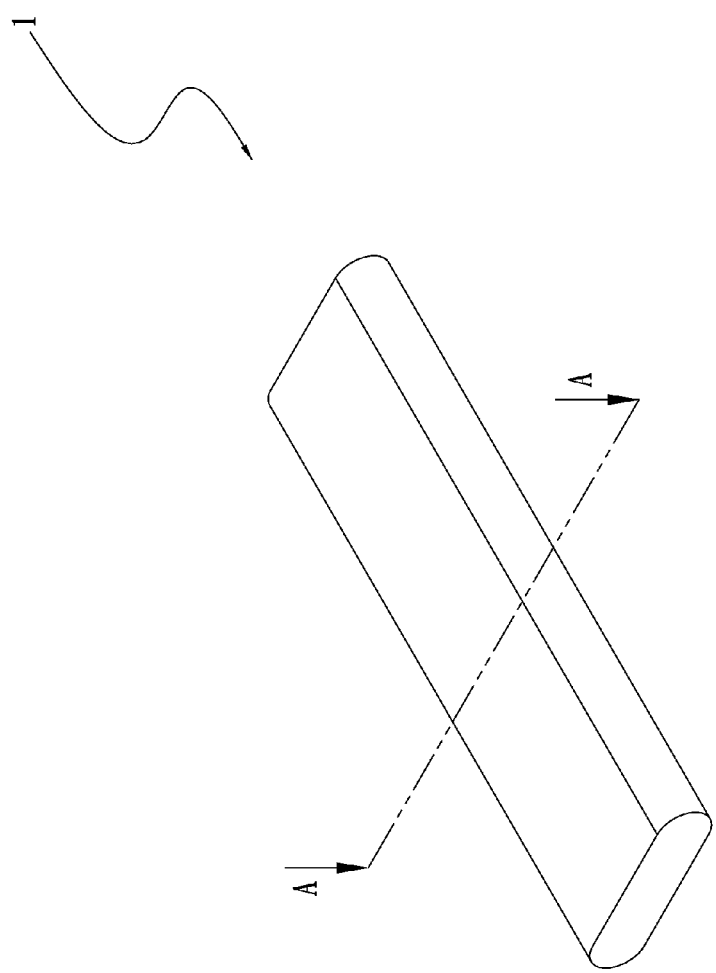
FIG. 1 is a perspective view of a first embodiment of the heat pipe structure of the present invention.
Figure 2:
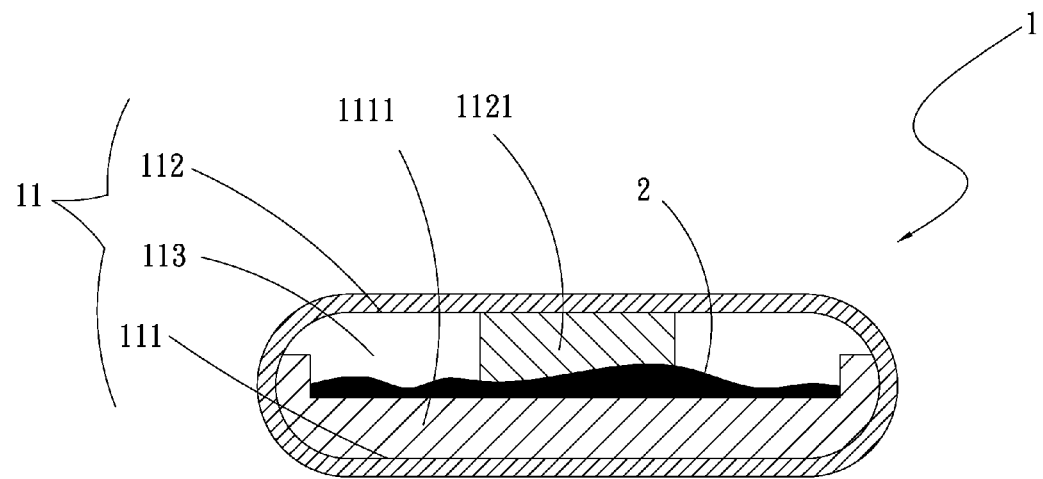
FIG. 2 is a sectional view taken along line A-A of FIG. 1.

Please refer to FIGS. 1 and 2. FIG. 1 is a perspective view of a first embodiment of the heat pipe structure of the present invention. FIG. 2 is a sectional view taken along line A-A of FIG. 1. According to the first embodiment, the heat pipe structure of the present invention includes a main body 1 having a chamber 11. The chamber 11 has a first side 111 and a second side 112. A first capillary structure 1111 and a second capillary structure 1121 are respectively disposed on the first and second sides 111, 112. A working fluid 2 is filled in the chamber 11. The first capillary structure 1111 has a radial extension range larger than or equal to one half of the circumference of the inner wall face of the chamber 11 and larger than the radial extension range of the second capillary structure 1121. One side of the first capillary structure 1111 is connected with the second capillary structure 1121. The first and second capillary structures 1111, 1121 and the inner wall face of the chamber 11 together define at least one vapor passage 113.

The first and second capillary structures 1111, 1121 are selected from a grouping consisting of sintered powder bodies, mesh bodies, fiber bodies and porous structure bodies. In this embodiment, the first and second capillary structures 1111, 1121 are, but not limited to, sintered powder bodies for illustration purposes only. The inner wall face of the chamber 11 is a smooth wall face.

Figure 3:
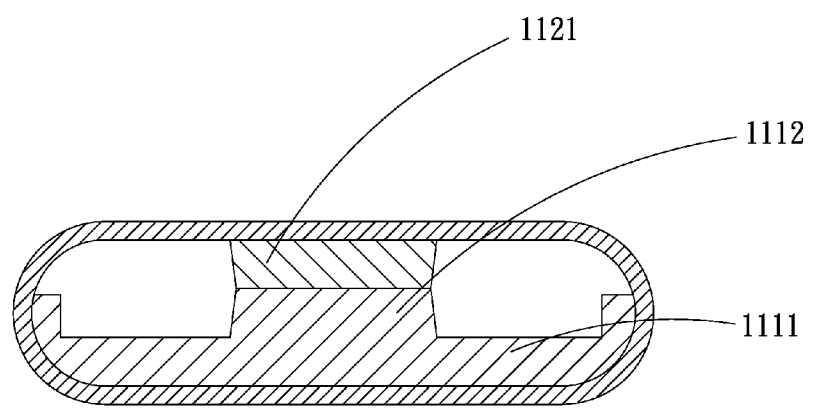
FIG. 3 is a sectional view of a second embodiment of the heat pipe structure of the present invention.

Please now refer to FIG. 3, which is a sectional view of a second embodiment of the heat pipe structure of the present invention. The second embodiment is partially identical to the first embodiment in structure and thus will not be repeatedly described hereinafter. The second embodiment is different from the first embodiment in that the first capillary structure 1111 has a first extension section 1112 extending from one side of the first capillary structure 1111. The first extension section 1112 is connected with the second capillary structure 1121.

Figure 4:
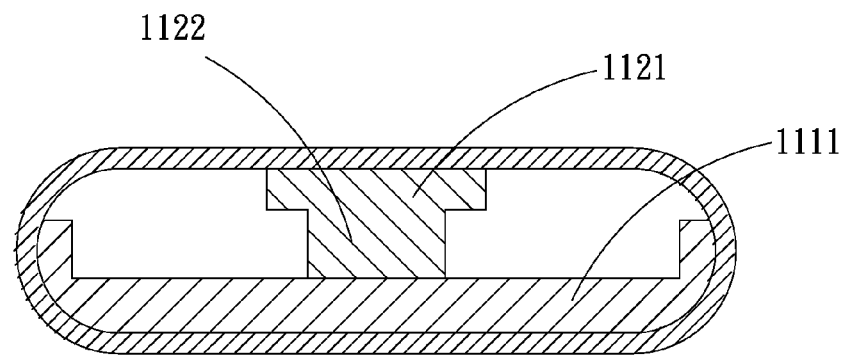
FIG. 4 is a sectional view of a third embodiment of the heat pipe structure of the present invention.

Please now refer to FIG. 4, which is a sectional view of a third embodiment of the heat pipe structure of the present invention. The third embodiment is partially identical to the first embodiment in structure and thus will not be repeatedly described hereinafter. The third embodiment is different from the first embodiment in that the second capillary structure 1121 has a second extension section 1122 extending from one side of the second capillary structure 1121. The second extension section 1122 is connected with the first capillary structure 1111.

Figure 5:
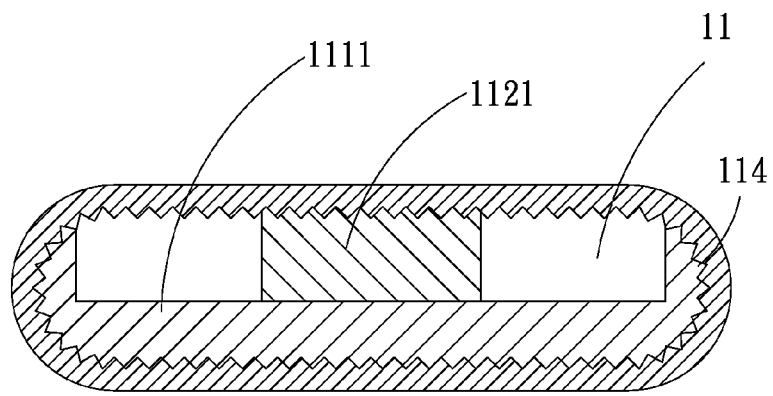
FIG. 5 is a sectional view of a fourth embodiment of the heat pipe structure of the present invention.

Please now refer to FIG. 5, which is a sectional view of a fourth embodiment of the heat pipe structure of the present invention. The fourth embodiment is partially identical to the first embodiment in structure and thus will not be repeatedly described hereinafter. The fourth embodiment is different from the first embodiment in that a third capillary structure 114 is disposed on the inner wall face of the chamber 11. The first and second capillary structures 1111, 1121 are connected with the third capillary structure 114. The third capillary structure 114 is selected from a grouping consisting of a sintered powder body, a mesh body, a fiber body and a structure formed with multiple channels. In this embodiment, the third capillary structure 114 is, but not limited to, a structure formed with multiple channels for illustration purposes only.

Figure 6:
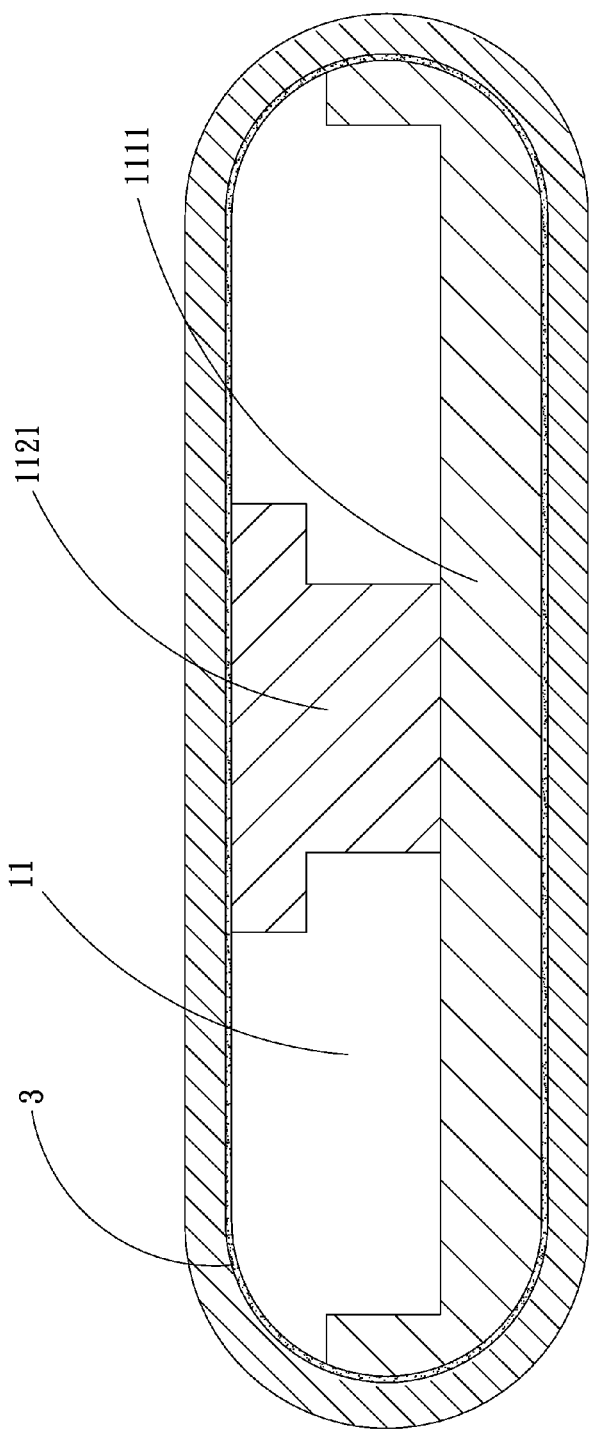
FIG. 6 is a sectional view of a fifth embodiment of the heat pipe structure of the present invention.

Please now refer to FIG. 6, which is a sectional view of a fifth embodiment of the heat pipe structure of the present invention. The fifth embodiment is partially identical to the first embodiment in structure and thus will not be repeatedly described hereinafter. The fifth embodiment is different from the first embodiment in that a coating 3 is further disposed on the inner wall face of the chamber 11. The coating 3 is disposed between the inner wall face of the chamber 11 and the first and second capillary structures 1111, 1121. The coating 3 is selected from a group consisting of a hydrophilic coating and a hydrophobic coating. Alternatively, as necessary, a part of the coating 3 can be a hydrophilic coating and another part of the coating 3 can be a hydrophobic coating.

Figure 7:
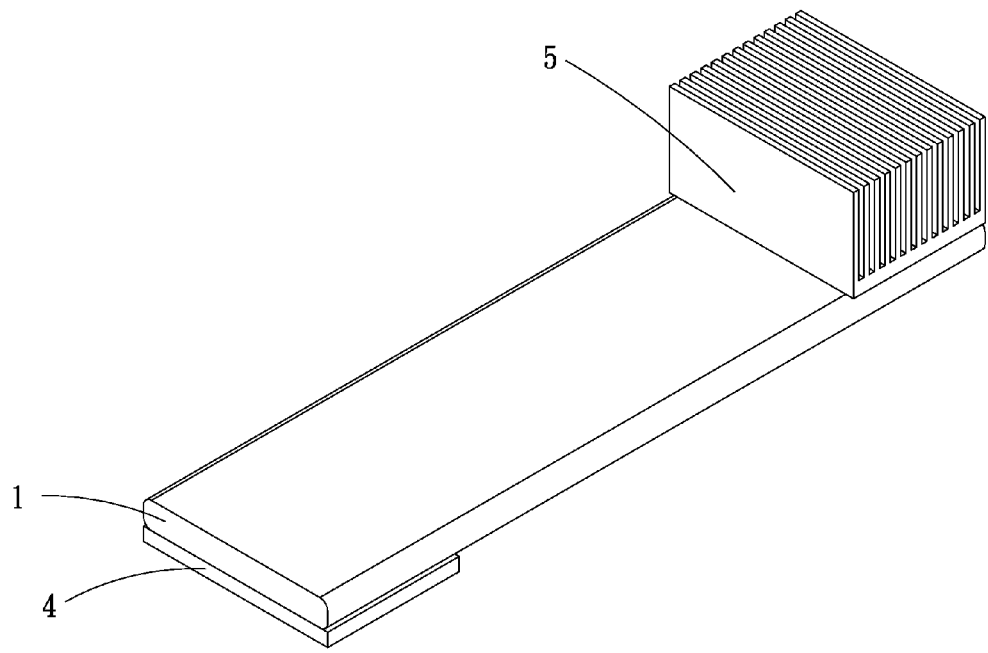
FIG. 7 is a perspective view showing the application of the heat pipe structure of the present invention.
Figure 8:
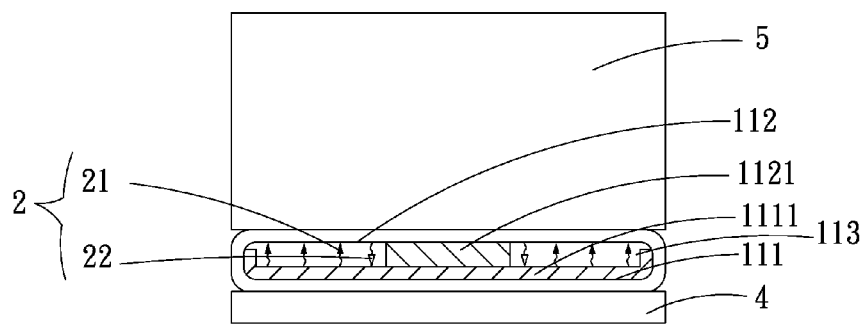
FIG. 8 is a sectional view showing the application of the heat pipe structure of the present invention.

Please now refer to FIGS. 7 and 8. FIG. 7 is a perspective view showing the application of the heat pipe structure of the present invention. FIG. 8 is a sectional view showing the application of the heat pipe structure of the present invention. As shown in FIGS. 7 and 8, an outer face of the first side 111 of the main body 1 is correspondingly assembled with at least one heat source 4 positioned at one end of the main body 1. A heat dissipation unit 5 is disposed at the other end of the main body 1 opposite to the end at which the heat source 4 is positioned. The heat dissipation unit 5 is selected from a group consisting of a heat sink, a radiating fin assembly and a water-cooled unit. In this embodiment, the heat dissipation unit 5 is, but not limited to, a heat sink for illustration purposes only.

In this embodiment, the first capillary structure 1111 of the main body 1 has a total volume larger than that of the second capillary structure 1121. In addition, the longitudinal extension range of the first capillary structure 1111 is larger than or just equal to one half of the circumference of the inner wall face of the chamber 11. The first capillary structure 1111 is disposed on the first side 111 of the main body 1 in contact with the heat source 4. The second capillary structure 1121 is disposed on the second side 112 of the main body 1 opposite to the first side 111. The working fluid 2 in the first capillary structure 1111 will absorb the heat generated by the heat source 4 and evaporate. Accordingly, the liquid working fluid 22 will be converted into vapor working fluid 21 to spread to the second side 112 of the main body 1. The vapor working fluid 21 is condensed into liquid working fluid 22 on the second side 112. The liquid working fluid 22 flows back to the first capillary structure 1111 via gravity or the capillary attraction of the second capillary structure 1121 to continue the vapor-liquid circulation. After the working fluid 2 is converted from liquid phase to vapor phase, the vapor working fluid 21 spreads from the first side 111 to the second side 112 through the vapor passage 113 of the main body 1. The volume of the second capillary structure 1121 is smaller than the volume of the first capillary structure 1111. Therefore, the pressure impedance against the spreading of the vapor working fluid 21 is reduced so that the vapor-liquid circulation efficiency of the working fluid 2 can be effectively increased. Also, the heat can be effectively transferred to the remote end from the heat source 4 without accumulating around the heat source 4. Accordingly, not only the radial heat conduction efficiency of the main body 1 can be increased, but also the axial heat conduction efficiency of the main body 1 can be greatly enhanced.

The above embodiments are only used to illustrate the present invention, not intended to limit the scope thereof. It is understood that many changes and modifications of the above embodiments can be made without departing from the spirit of the present invention. The scope of the present invention is limited only by the appended claims.

What is claimed is:

1. A heat pipe structure comprising a main body having a chamber, the chamber having a first side and a second side, and a working fluid filled in the chamber, a first capillary structure and a second capillary structure being respectively disposed on the first and second sides and being fiber bodies, the first capillary structure having a radial extension range larger than one half of a circumference of an inner wall face of the chamber and larger than a radial extension range of the second capillary structure, one side of the first capillary structure being connected at a single location only that is along a width of the second capillary structure, the first and second capillary structures and the inner wall face of the chamber together defining a first vapor passage and a second vapor passage;

wherein the first capillary structure is attached to but does not extend around the entire inner wall face of the chamber;

wherein an applied coating is further disposed on the entire inner wall face of the chamber, the coating being disposed between the entire inner wall face of the chamber and the first and second capillary structures wherein the coating is selected from the group consisting of hydrophilic and hydrophobic materials, the hydrophilic coating being disposed on the first side of the chamber, and the hydrophobic coating being disposed on the second side of the chamber; and wherein one end of an outer face of the first side of the chamber is correspondingly attached to at least one heat source for conducting heat at least one heat dissipation unit being correspondingly attached to an other end of an outer face of the second side, the heat dissipation unit being selected from a group consisting of a heat sink, a radiating fin assembly and a water-cooled unit, so that not only is the radial heat conduction efficiency of the main body increased, but also the axial heat conduction efficiency of the main body can be greatly enhanced.

* * * * *